United States Patent [19]

Itsuji

[11] Patent Number: 5,151,300
[45] Date of Patent: Sep. 29, 1992

[54] METHOD FOR FORMING A CARBON RESISTANCE IN A PRINTED WIRING BOARD

[75] Inventor: Junichi Itsuji, Iruma, Japan

[73] Assignee: Nippon CMK Corp., Japan

[21] Appl. No.: 682,927

[22] Filed: Apr. 9, 1991

[30] Foreign Application Priority Data

Apr. 17, 1990 [JP] Japan .................. 2-100631

[51] Int. Cl.⁵ .............................................. C23C 26/00
[52] U.S. Cl. ...................... 427/96; 427/122; 427/113; 427/270; 427/271; 427/353
[58] Field of Search ................ 427/96, 122, 113, 270, 427/271, 55, 353

[56] References Cited

U.S. PATENT DOCUMENTS 4,626,961 12/1986 Ono ...................... 361/398
4,918,814 4/1990 Redmond .............. 29/884

Primary Examiner—Michael Lusignan
Assistant Examiner—Vi Duong Dang
Attorney, Agent, or Firm—Bruce L. Adams; Van C. Wilks

[57] ABSTRACT

The method for forming a carbon resistance in a printed wiring board is characterized in that, in a method for forming a carbon resistance in the circuit of a printed wiring board, a carbon resistance to be disposed in the circuit which is formed in a laminated film is previously deposited on and correspondingly to the surface of said circuit, and the protective film of the carbon resistance of the laminated film is removed.

In accordance with the method for forming a carbon resistance in a printed wiring board, a carbon resistance which is previously formed in a laminated film and to be disposed in the printed wiring board circuit is deposited on and correspondingly to the surface of the circuit, and simultaneously the protective film of the carbon resistance of the laminated film is removed, thereby performing the formation, and it is thus possible to form a carbon resistance which always comprises a stable resistance value, without depending on the smoothness of the circuit surface or the forming conditions of the carbon resistance.

6 Claims, 1 Drawing Sheet

METHOD FOR FORMING A CARBON RESISTANCE IN A PRINTED WIRING BOARD

BACKGROUND OF THE INVENTION

1. Field of the Invention

The present invention is related to a method for forming a carbon resistance in the required position of a printed wiring board circuit.

2. Prior Art

As the conventional method for forming a resistance in a printed wiring board, there has been developed a method to replace the mounting of a chip component, in which a carbon paint is printed in a printed wiring circuit board circuit by silk screen printing and thereafter it is dried and cured.

SUMMARY OF THE INVENTION

However, if a carbon paint is printed on the required position in a printed wiring board circuit by the silk screen printing, irregularities occur in the film thickness of the carbon paint due to the irregularities of the smoothness of the surface of the printed wiring board circuit and the print conditions such as the printing pressure during the silk screen printing, and thus it is difficult to obtain a stable resistance value. In addition, a blurring phenomenon occurs during the silk screen printing, and thus there is a defect such as the requirement of the correction of the blurred positions in addition to the correction of the resistance value.

Accordingly, the present invention was made in view of the above problem in the conventional method for forming a carbon resistance in a printed wiring board, and the object thereof is to provide a method for forming a carbon resistance which always has a stable resistance value.

The method for forming a carbon resistance in a printed wiring board is characterized in that, in a method for forming a carbon resistance in the circuit of a printed wiring board, a carbon resistance to be disposed in the circuit which is formed in a laminated film is previously deposited on and correspondingly to the surface of said circuit, and the protective film of the carbon resistance of the laminated film is removed.

In accordance with the method for forming a carbon resistance in a printed wiring board, a carbon resistance which is previously formed in a laminated film and to be disposed in the printed wiring board circuit is deposited on and correspondingly to the surface of the circuit, and simultaneously the protective film of the carbon resistance of the laminated film is removed, thereby performing the formation, and it is thus possible to form a carbon resistance which always comprises a stable resistance value, without depending on the smoothness of the circuit surface or the forming conditions of the carbon resistance.

DESCRIPTION OF THE EMBODIMENT

Now, description is made to the particular embodiments of the method for forming a carbon resistance in a printed wiring board of the present invention in conjunction with the drawings.

First Embodiment

Figure 1:
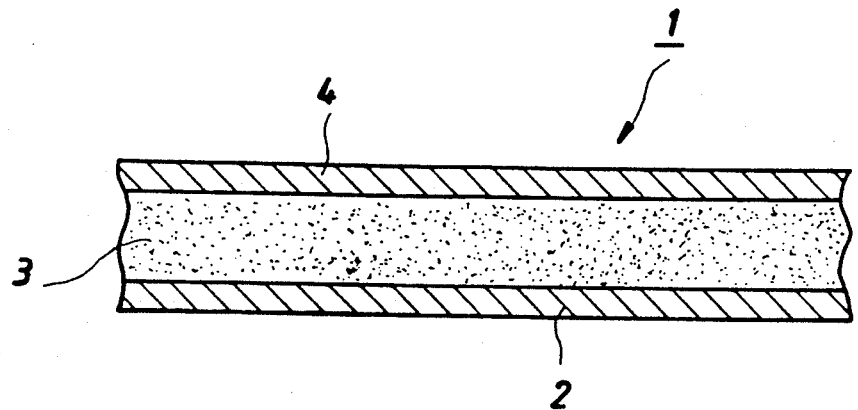
FIGS. 1 and 2 show the first embodiment of the method for forming a carbon resistance in a printed wiring board of the present invention, and they are sectional views of the carbon resistance film used for the same embodiment.
Figure 2:
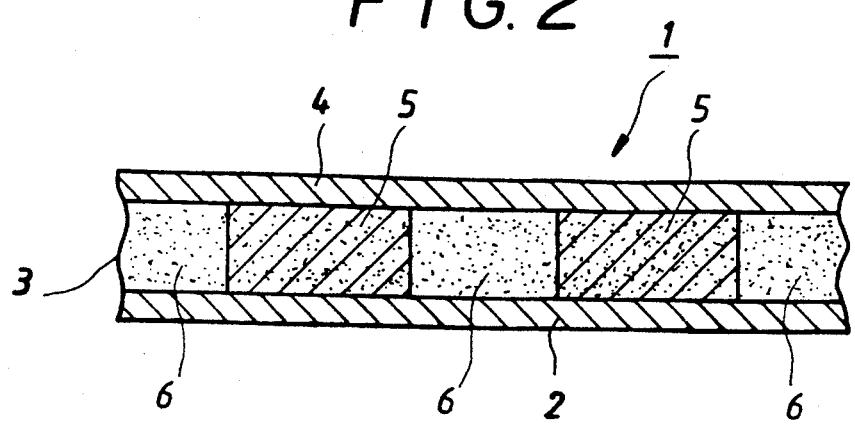

FIGS. 1 and 2 are sectional views of the carbon resistance film which is used for the method for forming a carbon resistance in a printed wiring board of the present invention.

Carbon resistance film 1 as shown is formed by providing a carbon resistance layer 3 comprised of a thermoset carbon paint of a required film thickness coated on laminated film 2, and covering the surface of carbon resistance film 3 with protective film 4 (refer to FIG. 1).

Then, by exposing carbon resistance layer 3 of the carbon resistance film 1 to infrared or far infrared rays so as to thermoset carbon resistance layer 3, along the disposal position at which a carbon resistance (not shown) is to be formed in the printed wiring circuit of a printed wiring board (not shown) wherein a required printed wiring circuit is formed on the surface or both sides of a substrate, carbon resistance 5 to be formed in the required position in the printed wiring circuit is formed (refer to FIG. 2).

Accordingly, carbon resistance film 1 which was thermoset is deposited on the circuit surface while aligning the carbon resistance 5 which was thermoset with the disposal position in the printed wiring circuit of the printed wiring board.

Thereafter, protective film 4 of carbon resistance film 1 is peeled off and the uncured portion 6 of carbon resistance layer 3 (See FIG. 2) is removed by applying a removal process such as water washing.

After such carbon resistance, the other processes required for the formation of the printed wiring board are performed such as the formation of an insulating layer.

In addition to the use of a single film of a required size as the carbon resistance film 1, it can be formed as an endless film so that it can continuously deposited on the printed wiring circuit surface of printed wiring boards with respect to a plurality of printed wiring boards, thereby enabling the formation method of the present invention to be implemented by a continuous work.

Second Embodiment

Figure 3:
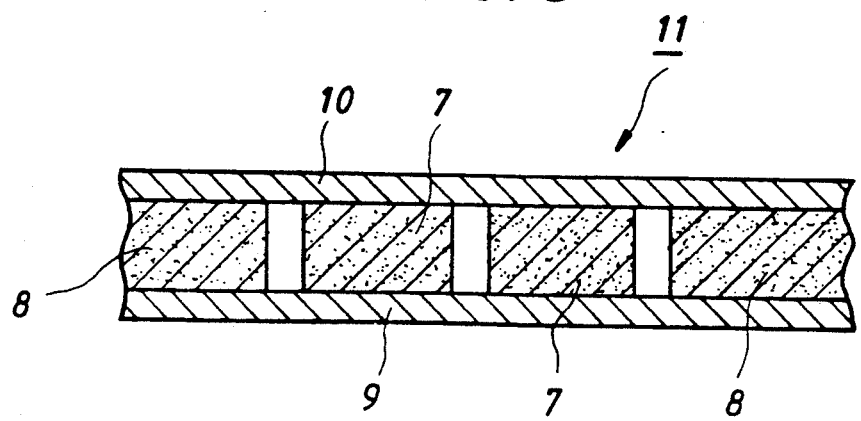
FIG. 3 is a sectional view of the carbon resistance film showing the second embodiment of the present invention.

FIG. 3 shows the second embodiment of the present invention, and it is a sectional view of the carbon resistance film which is used for forming the carbon resistance of the present invention.

In FIG. 3, 11 is the carbon resistance film used for the present embodiment, and the carbon resistance film 11 is formed on laminated film 9 by providing carbon resistances 7 and 8 for the respective resistance values required for the disposal in the printed wiring circuit of a printed wiring board, and covering the surfaces of the respective carbon resistances 7 and 8 with protective film 10.

Then, similarly to the first embodiment, the respective carbon resistances 7 and 8 are deposited on the printed wiring circuit surface of the printed wiring board while being aligned with the printed wiring circuit, and the subsequent processes similar to the first embodiment are performed, whereby the required carbon resistances can be formed in the printed wiring circuit of the printed wiring board.

As apparent from the above description, in accordance with the present invention, a carbon resistance can be formed which always has a stable resistance value.

What is claimed is:

1. A method for forming a carbon resistance in a circuit of a printed wiring board, comprising the steps of:

depositing carbon resistance to be used in said circuit on a laminated film in positions corresponding to the surface of said circuit, disposing a protective film on the carbon resistance, and removing the protective film from the carbon resistance while on said laminated film.

2. A method for forming a carbon resistance in a printed wiring board as set forth in claim 1 wherein said carbon resistance is deposited by providing a thermosettable carbon resistance layer on the laminated film and covering the surface with a protective film, and thermosetting the carbon resistance layer at said positions of said carbon resistance film corresponding to the surface of said circuit.

3. A method for forming a carbon resistance in a printed wiring board as set forth in claim 1 wherein said carbon resistance is deposited by disposing carbon resistance comprising required resistance values in the positions corresponding to the surface of the printed wiring circuit of said printed wiring board.

4. A method for forming carbon resistors on a printed circuit board having a printed circuit thereon, comprising:

disposing a layer of curable carbon resistor material on a laminated film in given positions corresponding to positions on the printed circuit where resistors are required;

covering the layer of curable carbon resistor material with a protective film;

curing the curable carbon resistor material through the protective film to form carbon resistors at the given positions; and removing the protective film to expose the carbon resistors at the given positions.

5. A method according to claim 4, wherein the curable carbon resistor material is thermosettable and is disposed over the whole laminated film; and further comprising thermosetting the carbon material only in the given positions and removing the remaining carbon material which is not thermoset after removal of the protective film.

6. A method according to claim 4, wherein the carbon resistor material is disposed on the laminated film in discrete areas at the given positions and has prescribed resistance values at the respective given positions.

* * * * *